(12) United States Patent
Muela

(10) Patent No.: US 11,224,936 B2
(45) Date of Patent: Jan. 18, 2022

(54) METHOD AND DEVICE FOR PRODUCING A WELDED ASSEMBLY

(71) Applicant: SCHUNK SONOSYSTEMS GMBH, Wettenberg (DE)

(72) Inventor: Valentin Muela, Solms (DE)

(73) Assignee: SCHUNK SONOSYSTEMS GMBH, Wettenberg (DE)

( * ) Notice: Subject to any disclaimer, the term of this patent is extended or adjusted under 35 U.S.C. 154(b) by 184 days.

(21) Appl. No.: 16/496,118

(22) PCT Filed: Mar. 15, 2018

(86) PCT No.: PCT/EP2018/056587
§ 371 (c)(1),
(2) Date: Sep. 20, 2019

(87) PCT Pub. No.: WO2018/172189
PCT Pub. Date: Sep. 27, 2018

(65) Prior Publication Data
US 2020/0094349 A1    Mar. 26, 2020

(30) Foreign Application Priority Data

Mar. 21, 2017    (DE) .................... 10 2017 204 657.0

(51) Int. Cl.
*B23K 20/10*    (2006.01)
*B29C 65/08*    (2006.01)
(Continued)

(52) U.S. Cl.
CPC ............ *B23K 20/106* (2013.01); *B29C 65/08* (2013.01); *B23K 2101/38* (2018.08);
(Continued)

(58) Field of Classification Search
CPC .............. B23K 20/106; B23K 2101/38; B23K 2101/40; B23K 20/10; B23K 20/26;
(Continued)

(56) References Cited

U.S. PATENT DOCUMENTS

| 5,456,403 A | 10/1995 | Nishimaki et al. |
| 2001/0016786 A1* | 8/2001 | Takahashi .......... G05B 19/4015 700/195 |

(Continued)

FOREIGN PATENT DOCUMENTS

| CN | 1672855 A | 9/2005 |
| CN | 1702847 A | 11/2005 |
| CN | 1839010 A | 9/2006 |

OTHER PUBLICATIONS

International Search Report dated Jun. 25, 2018 in connection with PCT/EP2018/056587.

*Primary Examiner* — Marc C Howell
*Assistant Examiner* — Abhishek A Patwardhan
(74) *Attorney, Agent, or Firm* — Quarles & Brady LLP

(57) ABSTRACT

The disclosure relates to a method for producing a welded assembly including a plurality of welded connections between first contact partners of a contact substrate and second contact partners of a placement unit. The contact partners are arranged in an overlapping position and a sonotrode is moved into a position overlapping with the second contact partner using a positioning device, is lowered onto the second contact partner in a welding contact position, and is subjected to ultrasonic vibrations to produce a welded connection. The sonotrode is positioned relative to the second contact partner with a camera and the sonotrode is positioned relative to the second contact partner based on a determination of a position deviation of a sonotrode (Continued)

imprint of a sonotrode working surface produced on a reference imprint carrier by the welding process.

4 Claims, 2 Drawing Sheets

(51) Int. Cl.
*B23K 101/38* (2006.01)
*B29C 65/00* (2006.01)
*H01R 43/02* (2006.01)

(52) U.S. Cl.
CPC ....... *B29C 66/1122* (2013.01); *B29C 66/8322* (2013.01); *H01R 43/0207* (2013.01)

(58) Field of Classification Search
CPC . B29C 65/08; B29C 66/1122; B29C 66/8322; H01R 43/0207; H01L 24/74; B06B 3/00
See application file for complete search history.

(56) References Cited

U.S. PATENT DOCUMENTS

| | | | |
|---|---|---|---|
| 2001/0042770 A1 | 11/2001 | Hayata et al. | |
| 2004/0200884 A1* | 10/2004 | Adorni | B23K 20/004 228/180.5 |
| 2010/0006231 A1 | 1/2010 | Masuda et al. | |

\* cited by examiner

Fig. 1
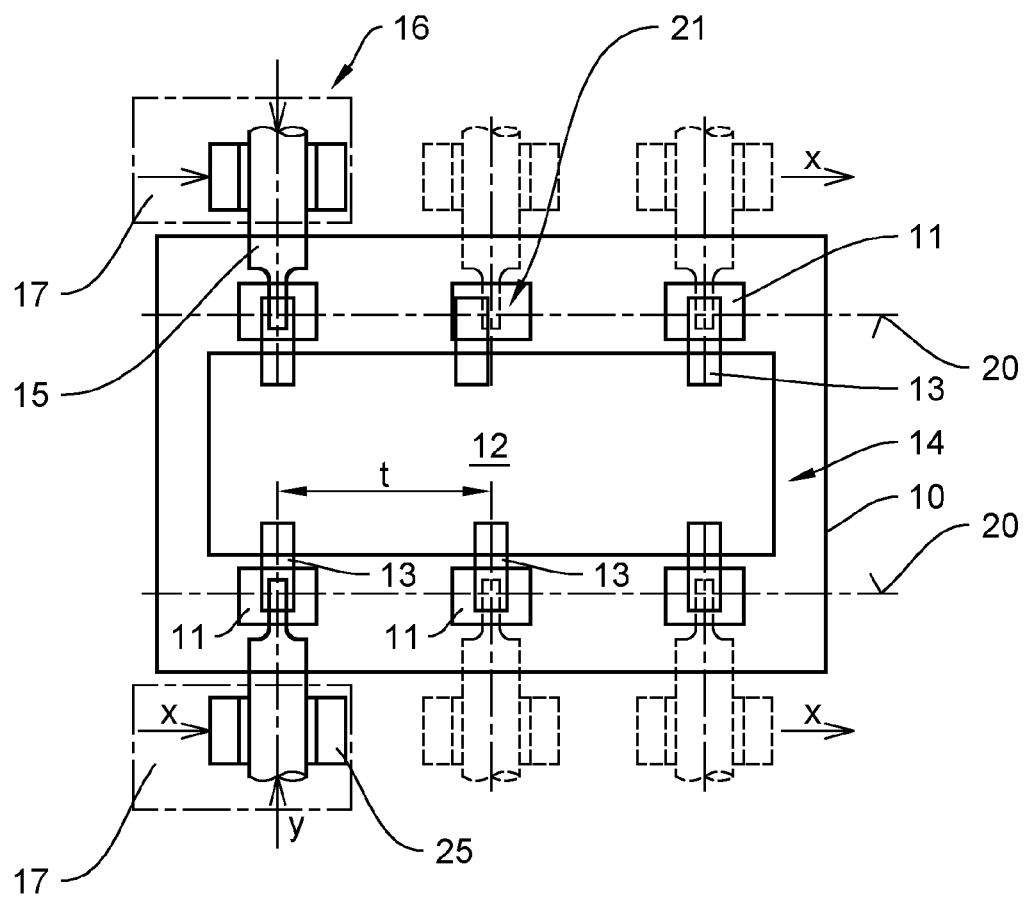
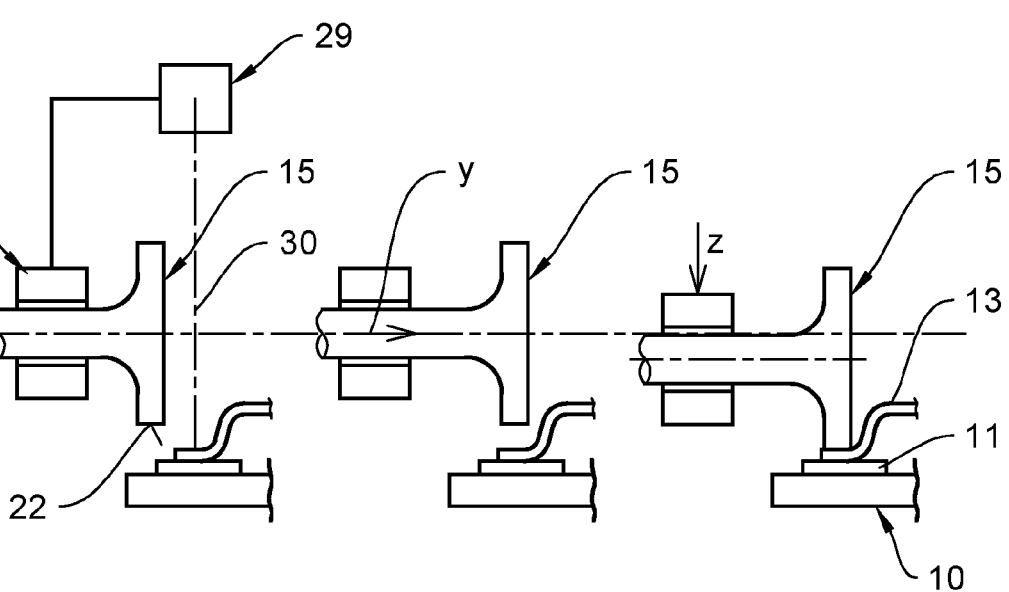
Fig. 2  Fig. 3  Fig. 4

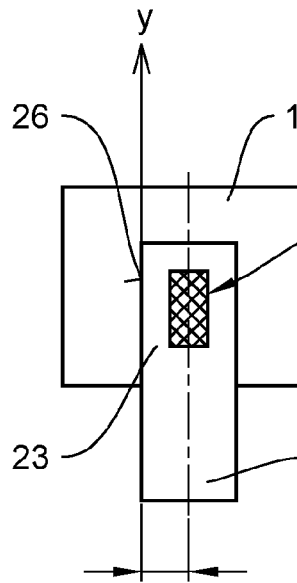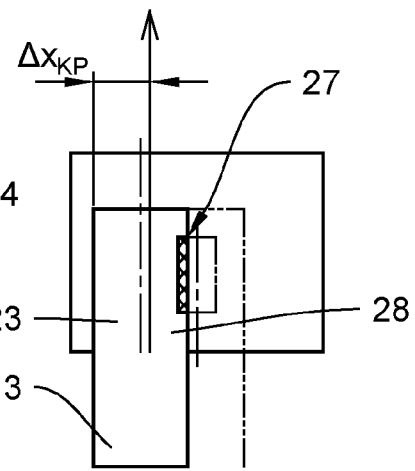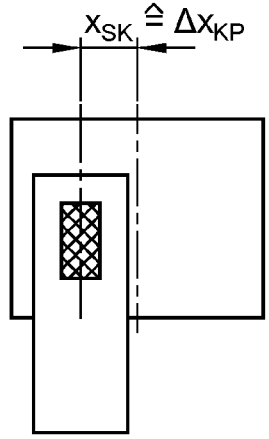
Fig. 5  Fig. 6  Fig. 7
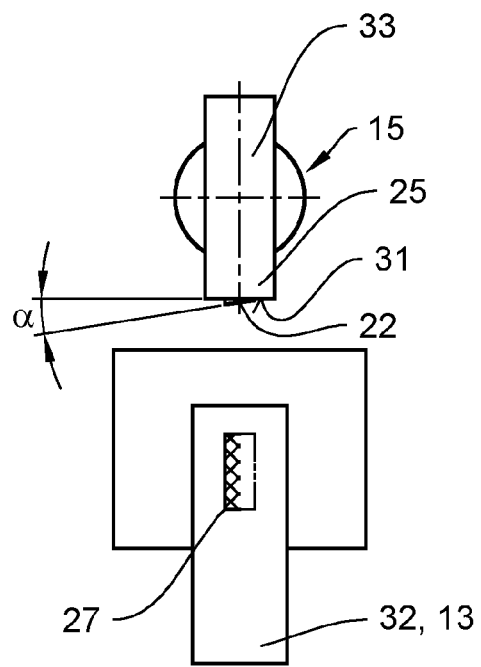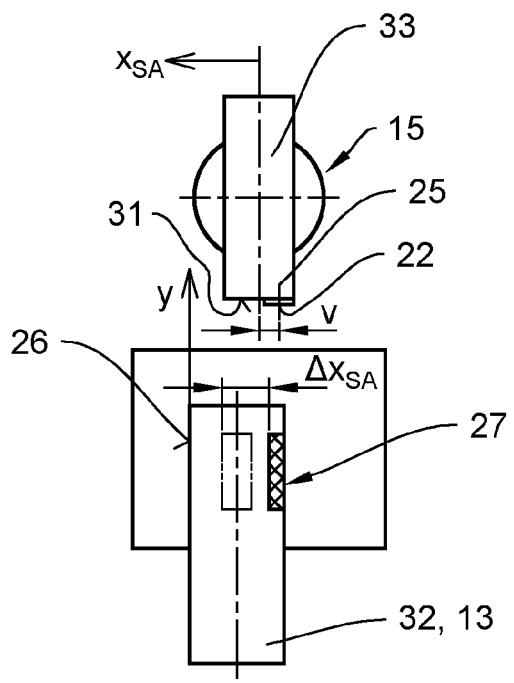
Fig. 8  Fig. 9

METHOD AND DEVICE FOR PRODUCING A WELDED ASSEMBLY

This application represents the national stage entry of PCT International Application No. PCT/EP2018/056587 filed Mar. 15, 2018, which claims priority of German Patent Application No. 10 2017 204 657.0, filed Mar. 21, 2017, the disclosures of which are incorporated by reference here in their entirety for all purposes.

The present disclosure relates to a method for producing a welded assembly comprising a plurality of welded connections between first contact partners of a contact substrate and second contact partners of a placement unit, which is preferably a semiconductor assembly, in which the contact partners are arranged in an overlapping position to position the first and second contact partners relative to each other in a welding position and a sonotrode is arranged in a position overlapping with the second contact partner by means of a positioning device to position the sonotrode in the individual welding positions and is lowered onto the second contact partner in a welding contact position and is subjected to ultrasonic vibrations to produce a welded connection, the sonotrode being positioned relative to the second contact partner by means of a camera device, which is provided with an image processing device, in such a manner that the sonotrode is positioned relative to the second contact partner based on a determination of a position deviation of a sonotrode imprint of a sonotrode working surface of the sonotrode produced on a reference imprint carrier by the welding process. Moreover, the disclosure relates to a device for implementing the method.

To produce power modules, in particular, in which a plurality of terminals of a semiconductor assembly are in electrical contact with a corresponding number of terminal faces of a circuit substrate, a largely automated production of the connection points is carried out in ultrasonic welding technology, too, the terminals being welded to the terminal faces by means of a sonotrode which is successively moved toward the welding positions, which are disposed at regular intervals on an axis, and moved from the respective welding position against the terminal disposed on the terminal face in the welding contact position.

This results in the necessity that the contact of the sonotrode with the second contact partner, which is a terminal, is established as reliably as possible and thus also in the correct relative position for the execution of the welding process. Since the distances between the terminal faces are typically identical to the distances between the terminals and the positioning device executes an indexed feed motion that corresponds to the distances, the sonotrode arrives in a correct position relative to the second contact partners, which are terminals, without issue as long as the terminals are not misaligned, such as bent due to external force, for example.

In the methods applied so far for automated ultrasonic welding of the terminals of the semiconductor assemblies to the substrate terminal faces, a camera device provided with an image processing device is used to position the sonotrode relative to the terminals, which, when a position deviation of the sonotrode relative to the second contact partner is determined, allows the extent of the position deviation to be determined and to be accordingly corrected during positioning of the sonotrode relative to the terminal, if necessary.

Positioning of the sonotrode relative to the positioning device, which may become necessary after replacement of the sonotrode, for example, takes place using an axis measuring system in which the position of a sonotrode working surface, which defines the area of the welded connection between the contact partners, is set indirectly via the axial distance of reference edges defined on the sonotrode from corresponding reference edges of the positioning device. Any position misalignments of the sonotrode working surface of the sonotrode are compensated through a change in the arrangement of the sonotrode relative to the positioning device, i.e. by changing how the sonotrode is clamped in a sonotrode holder, for example. This involves a corresponding amount of work, especially after replacement of a sonotrode.

The object of the present disclosure is to provide a method and a device that allow sonotrode misalignments to be corrected with a lower amount of work.

To attain said object, the method according to the disclosure has the features of claim 1.

According to the disclosure, the sonotrode is positioned relative to the second contact partner by means of a camera device, which is provided with an image processing device, in such a manner that the sonotrode is positioned relative to the second contact partner based on a determination of a position deviation of a sonotrode imprint of a sonotrode working surface of the sonotrode produced on a reference imprint carrier by the welding process.

A misaligned sonotrode exhibiting a position deviation of the sonotrode working surface, such as a sonotrode working surface not disposed centrally, but at a lateral offset in a sonotrode surface, can thus be compensated when positioning the sonotrode in the welding position without having to replace the sonotrode or to change the way the sonotrode is clamped in the sonotrode holder. Instead, the sonotrode misalignment can be compensated using the positioning device, the extent of the compensation required depending on the extent of the position deviation of the sonotrode imprint from a defined target position of the sonotrode imprint on the reference imprint carrier.

The reference imprint carrier can be a strip of material corresponding to the second contact partner in terms of its design and its material, in particular. Of course, a second contact partner can also serve as a reference imprint carrier.

Preferably, the sonotrode is positioned relative to the second contact partner both based on a position deviation of the sonotrode relative to the second contact partner and based on the position deviation of the sonotrode imprint of the sonotrode working surface of the sonotrode produced on the reference imprint carrier by the welding process, both position deviations being determined using the camera device provided with an image processing device. Thus, both position deviations can be detected by the same device.

If a total position deviation consisting of said position deviations is superimposed on a feed path of the positioning device, which corresponds to the distance between first contact partners of the contact substrate, the compensation of the position deviations and the feed motion for transferring the sonotrode from one welding position into the next welding position can be executed as a single feed motion.

Preferably, the position deviation of the sonotrode imprint is determined after a change in the position of the sonotrode relative to the positioning device, such as after a sonotrode replacement, allowing the determined position deviation to be taken into account as an invariable value for the subsequent positioning of the sonotrode into the different welding positions when approaching the subsequent welding positions. If required, it is also possible of course to determine the position deviation of the sonotrode imprint after each welding process and to take it into account when approaching the subsequent welding position.

According to the disclosure, the camera device provided with an image processing device is disposed on the positioning device in such a manner that the contact partners are located in an image plane defined by the camera device in each of the welding positions successively approached by the positioning device.

Preferably, the position of the camera device relative to a sonotrode holder disposed on the positioning device is fixed.

Hereinafter, a preferred embodiment of the disclosure will be explained in more detail with reference to the drawings.

FIG. 1 shows a contact substrate disposed on a contact substrate holder and having two sonotrodes displaceable relative to the contact substrate by means of a positioning device;

FIG. 2 shows a side view of a sonotrode disposed in a sonotrode holder;

FIG. 3 shows the sonotrode of FIG. 2 in the initial position;

FIG. 4 shows the sonotrode of FIG. 2 in the welding contact position;

FIG. 5 shows a sonotrode imprint in the case of a properly aligned welded connection;

FIG. 6 shows a sonotrode imprint in the case of a misaligned contact partner;

FIG. 7 shows a sonotrode imprint after adjustment of the sonotrode position to the misaligned contact partner;

FIG. 8 shows a sonotrode imprint of a misaligned sonotrode;

FIG. 9 shows a sonotrode imprint of a misaligned sonotrode.

FIG. 1 is a schematic illustration showing a top view of a contact substrate 10 comprising a plurality of first contact partners 11 disposed in contact rows 20 and realized as contact surfaces and a semiconductor assembly 12 provided with a plurality of terminals 13 forming second contact partners 13. To produce a welded assembly 14 from contact substrate 10 and semiconductor assembly 12, starting from the relative position of second contact partners 13 of semiconductor assembly 12 on first contact partners 11 of contact substrate 10 as illustrated in FIG. 1, ultrasonic welding units 16 each provided with a sonotrode 15 and disposed on a longitudinal side of contact substrate 10 are successively moved into an initial position above second contact partners 13 as illustrated in FIGS. 1 and 3 and then lowered into the welding contact position illustrated in FIG. 4 by means of positioning devices 17. To this end, positioning devices 17 allow sonotrodes 15 to be moved in the x, y, and z directions along the three spatial axes.

FIG. 1 shows a sonotrode 15 disposed on each longitudinal side of contact substrate 10, said sonotrode 15 being moved into the subsequent welding positions, which are illustrated by dashed lines, after completion of a first welded connection.

The illustration in FIG. 1 shows that the initial position of sonotrode 15 is defined by a corresponding position of a sonotrode working surface 22 (FIGS. 2 to 4) in the x/y plane. As apparent from a combined view of FIGS. 3 and 4, starting from the initial position, sonotrode working surface 22 of sonotrode 15 is lowered onto upper second contact partner 13 into the welding position at a defined contact pressure, and sonotrode 15 is subjected to ultrasonic vibrations so as to execute the welding process.

As shown in FIG. 5, in particular, once the welding process is complete, a sonotrode imprint 24 has been formed on second contact partner 13 as a result of second contact partner 13 having been subjected to ultrasonic vibrations with sonotrode working surface 22, sonotrode imprint 24 being caused by a profiled surface of sonotrode working surface 22 imprinting on a contact surface 23 of second contact partner 13, leading to a negative of the profiled sonotrode working surface being visible on contact surface 23.

In FIG. 5, a properly aligned welded connection is illustrated, in which a full overlap has been established between first contact partner 11 and second contact partner 13 and full sonotrode imprint 24 has been imprinted on contact surface 23 of second contact partner 13.

In contrast to FIG. 5, FIG. 6 shows a misaligned welded connection bearing an incomplete sonotrode imprint 27 on contact surface 23 of second contact partner 13, which is due to second contact partner 13 not being located in its target position relative to first contact partner 11 as illustrated in FIG. 5. This may be because second contact partner 13 is bent, for example.

When sonotrodes 15 are successively transferred into the respective initial positions along contact rows 20, sonotrode holders 25 equipped with sonotrodes 15 undergo an indexed forward motion corresponding to distances t of first contact partners 11. Distances t of second contact partners 13 of semiconductor assembly 12, which are also disposed in rows 20, are typically identical to the distances of first contact partners 11, the overlap between second contact partners 13 and first contact partners 11 required for the execution of a properly aligned ultrasonic welding process thus typically happening automatically.

In practice, however, it was found that occasional misaligned positions of second contact partners 13 do very well occur, such as shown in FIG. 1 with middle contract pair 21 in upper contact row 20 as an example, where second contact partner 13 exhibits an offset $\Delta x_{KP}$ (illustrated in FIG. 6) relative to the target position (illustrated in FIG. 5) of a reference edge 26 of second contact partner 13, said offset $\Delta x_{KP}$ being present in direction x only in the present example and causing a sonotrode 15 moved forward in direction x along contact row 20 by distance t of first contact partners 11 to now be located in an initial position in which sonotrode 15 is not located in a position relative to second contact partner 13 that would allow a welding contact for producing sonotrode imprint 24 illustrated in FIG. 5. Instead, a welding contact starting from the relative position of sonotrode working surface 22 relative to second contact partner 13 as illustrated in FIG. 1 would lead to the formation of a sonotrode imprint 27 as illustrated by way of example in FIG. 6 in such a manner that, corresponding to sonotrode imprint 27, a welded connection between first contact partner 11 and second contact partner 13 would merely be formed in a narrow edge portion 28 of contact partner 13.

As explained above with reference to FIG. 1, sonotrodes 15 are held in sonotrode holders 25 which are displaceable in the direction of the x axis, i.e. along contact rows 20 of contact substrate 10, by means of sonotrode positioning device 17. Sonotrode positioning device 17 preferably also allows sonotrodes 15 to be displaced relative to sonotrode holders 25, thus allowing sonotrode 15 and sonotrode working surface 22 to be displaced in direction y from a retracted position, which is illustrated in FIG. 2, into the initial position above contact pair 21, which is illustrated in FIG. 3, and then to be displaced, also by means of sonotrode positioning device 17, into a welding contact position by a movement in the direction of the z axis to execute the welded connection.

A camera device 29 is located on sonotrode holder 25, preferably above sonotrode 15, optical axis 30 of camera device 29 being directed at contact pair 21 in such a manner that an image processing device associated with camera device 29 can determine position deviation $\Delta x_{KP}$, $\Delta y_{KP}$ based on the known target position of reference edge 26 of second contact partner 13 and position deviation $\Delta x_{KP}$, $\Delta y_{KP}$ can be converted into a corresponding positioning signal and be transmitted to positioning device 17, which transmits said positioning parameter to sonotrode holder 25 for making sonotrode 15 travel a positioning path $x_{SK}$, $y_{SK}$. For simplification, FIGS. 6 and 7 merely show position deviations in direction x. Thus, sonotrode 15 is then located in a corrected initial position which allows sonotrode working surface 22 to come into a welding contact with second contact partner 13 that produces sonotrode imprint 24 illustrated in FIG. 7.

FIG. 5 shows an ideal welding contact formation with a substantially central sonotrode imprint 24 on second contact partner 13. Such a relative positioning of sonotrode imprint 24 depends on a suitable relative positioning of sonotrode 15 and, in particular, of sonotrode working surface 22, which produces sonotrode imprint 24, relative to first contact partners 11 formed by the contact surfaces of contact substrate 10.

Hence, after sonotrode replacement, in particular, the positioning of sonotrode 15 in sonotrode holder 25 has required adjustment so far in order to compensate any tolerances in the arrangement of sonotrode working surface 22 in a contact surface 31 formed on a sonotrode head 33. In particular, sonotrode working surface 22 can exhibit position tolerances such as sonotrode working surface 22 not being parallel to contact surface 31 but inclined by a misalignment angle $\alpha$ relative to contact surface 31. This position deviation has the effect that, as illustrated in FIG. 8, for example, sonotrode imprint 27—and thus the welding contact—is incomplete after a welding contact between sonotrode working surface 22 and a reference imprint carrier 32 or a second contact partner 13 even if sonotrode 15 is positioned correctly relative to first contact partner 11 and reference imprint carriers 32 or second contact partner 13 is positioned correctly relative to first contact partner 11.

An incomplete welding contact is also the result if, as illustrated in FIG. 9, sonotrode working surface 22 is not positioned in the middle of contact surface 31 of sonotrode head 33 but at an offset v, causing to an incomplete sonotrode imprint 27 to be formed in this case, too.

In the case of incomplete sonotrode imprint 27 illustrated in FIG. 8, which points at sonotrode working surface 22 and the contact surface not being parallel if sonotrode 15 is correctly aligned in sonotrode holder 25, sonotrode 15 will typically have to be replaced because this is a sonotrode misalignment that cannot be compensated by means of positioning device 17.

In the case of the lateral offset v illustrated in FIG. 9, offset v can be compensated by means of sonotrode positioning device 17. To do so, camera device 29 described above and provided with image processing device 30 can be used to determine position deviation $\Delta x_{SA}$, which is present in direction x only in the case at hand, and position deviation $\Delta x_{SA}$ can be transmitted to sonotrode 15 for correction through positioning device 17 travelling a corresponding positioning path $x_{SA}$.

When subsequent welding processes are executed, positioning device 17 travels positioning path $x_{SA}$, which serves to compensate the tolerance misalignment of sonotrode 15, in addition to positioning path $x_{KP}$, which is individually determined for each second contact partner 13, when approaching each initial position.

The invention claimed is:

1. A method for producing a welded assembly comprising a plurality of welded connections between first contact partners of a contact substrate and second contact partners of a placement unit, which is a semiconductor assembly, arranging the contact partners in an overlapping position to position the first and second contact partners relative to each other in a welding position and moving a sonotrode into a position overlapping with the second contact partner using a positioning device to position the sonotrode in individual welding positions and lowering the sonotrode onto the second contact partner in a welding contact position and subjecting the sonotrode to ultrasonic vibrations to produce a welded connection, the sonotrode being positioned relative to the second contact partner with a camera device, which is provided with an image processing device, in such a manner that the sonotrode is positioned relative to the second contact partner based on a determination of a position deviation $\Delta x_{SA}$, $\Delta y_{SA}$ of a sonotrode imprint of a sonotrode working surface of the sonotrode produced on a reference imprint carrier by the welding process.

2. The method according to claim 1, wherein the sonotrode is positioned relative to the second contact partner both based on a position deviation $\Delta x_{KP}$, $\Delta y_{KP}$ of the sonotrode relative to the second contact partner and based on the position deviation $\Delta x_{SA}$, $\Delta y_{SA}$ of the sonotrode imprint of the sonotrode working surface of the sonotrode produced on the reference imprint carrier by the welding process, both position deviations $\Delta x_{KP}$, $\Delta y_{KP}$; $\Delta x_{SA}$, $\Delta y_{SA}$ being determined using the camera device provided with an image processing device.

3. The method according to claim 1, wherein a total position deviation which consists of position deviations $\Delta x_{KP}$, $\Delta y_{KP}$; $\Delta x_{SA}$, $\Delta y_{SA}$ is superimposed on a feed path of the positioning device which corresponds to a distance t between first contact partners of the contact substrate.

4. The method according to claim 1, wherein the position deviation $\Delta x_{SA}$, $\Delta y_{SA}$ of the sonotrode imprint is determined after a change in the position of the sonotrode relative to the positioning device.

\* \* \* \* \*